(12) United States Patent
Wang

(10) Patent No.: US 11,539,016 B2
(45) Date of Patent: Dec. 27, 2022

(54) LIGHT-EMITTING DEVICE, DISPLAY APPARATUS AND MANUFACTURING METHOD

(71) Applicant: BOE Technology Group Co., Ltd., Beijing (CN)

(72) Inventor: Tieshi Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 7 days.

(21) Appl. No.: 17/351,312

(22) Filed: Jun. 18, 2021

(65) Prior Publication Data

US 2022/0173344 A1 Jun. 2, 2022

(30) Foreign Application Priority Data

Nov. 27, 2020 (CN) .......................... 202011354418.4

(51) Int. Cl.
*H01L 29/08* (2006.01)
*H01L 51/50* (2006.01)
*H01L 51/56* (2006.01)

(52) U.S. Cl.
CPC .......... *H01L 51/508* (2013.01); *H01L 51/502* (2013.01); *H01L 51/5004* (2013.01); *H01L 51/5036* (2013.01); *H01L 51/56* (2013.01); H01L 2251/5369 (2013.01); H01L 2251/558 (2013.01)

(58) Field of Classification Search
CPC ................................................ H01L 51/508
See application file for complete search history.

(56) References Cited

U.S. PATENT DOCUMENTS

2002/0189542 A1* 12/2002 Van Slyke .............. C23C 14/12
118/712
2003/0211651 A1* 11/2003 Krasnov .............. C09K 11/883
438/102

(Continued)

*Primary Examiner* — Caleb E Henry
(74) *Attorney, Agent, or Firm* — ArentFox Schiff LLP; Michael Fainberg

(57) ABSTRACT

The present disclosure discloses a light-emitting device, a display apparatus and a manufacturing method. The light-emitting device includes: an electron transfer layer located between a light-emitting layer and a cathode, where a material of the electron transfer layer includes an inner core and a shell layer wrapping the inner core; when the number of electrons reaching the light-emitting layer in unit time is greater than the number of holes reaching the light-emitting layer in unit time, and a difference value between the number of the electrons reaching the light-emitting layer in unit time and the number of the holes reaching the light-emitting layer in unit time exceeds a preset threshold range, a particle size of the inner core is reduced and/or a thickness of the shell layer is increased; and when the number of the electrons reaching the light-emitting layer in unit time is smaller than the number of the holes reaching the light-emitting layer in unit time, and the difference value between the number of the electrons reaching the light-emitting layer in unit time and the number of the holes reaching the light-emitting layer in unit time exceeds the preset threshold range, the particle size of the inner core is increased and/or the thickness of the shell layer is reduced.

20 Claims, 8 Drawing Sheets

(56) References Cited

U.S. PATENT DOCUMENTS

| | | | |
|---|---|---|---|
| 2005/0098207 A1* | 5/2005 | Matsumoto | H01L 51/5088 313/506 |
| 2008/0264475 A1* | 10/2008 | Ito | B82Y 10/00 136/252 |
| 2009/0243473 A1* | 10/2009 | Iwakuma | H01L 51/5048 313/504 |
| 2012/0086331 A1* | 4/2012 | Kobayashi | H01L 51/56 313/504 |
| 2016/0150619 A1* | 5/2016 | Krummacher | H05B 45/60 315/224 |
| 2016/0233449 A1* | 8/2016 | Murayama | H01L 51/5004 |
| 2017/0012231 A1* | 1/2017 | Mishima | H01L 27/3244 |
| 2020/0321490 A1* | 10/2020 | Yang | H01L 51/502 |
| 2020/0321546 A1* | 10/2020 | He | H01L 51/56 |
| 2020/0328380 A1* | 10/2020 | Benzie | H01L 51/5056 |

* cited by examiner

LIGHT-EMITTING DEVICE, DISPLAY APPARATUS AND MANUFACTURING METHOD

This application claims priority to Chinese Patent Application No. 202011354418.4, filed on Nov. 27, 2020, which is hereby incorporated by reference in its entirety.

FIELD

The present disclosure relates to the field of display, in particular to a light-emitting device, a display apparatus and a manufacturing method.

BACKGROUND

An organic light-emitting display device was once considered to be hopeful to be a next-generation display device for replacing a liquid crystal display device, but along with improvement of the consumption level of consumers, a high-resolution product becomes the key development direction of a display product.

On the other hand, along with deep development of the quantum dot technology, research of the electrogenerated quantum dot light-emitting diode is increasingly deepened, the quantum efficiency is continuously improved and basically reaches the industrialization level, and industrialization of the electrogenerated quantum dot light-emitting diode by adopting a new process and technology becomes a future trend.

At present, a conventional light-emitting device structure includes a hole injection layer (HI), a hole transfer layer (HT), a light-emitting layer (QD layer) and an electron transfer layer (ET).

SUMMARY

The present disclosure provides a light-emitting device, a display apparatus and a manufacturing method.

An embodiment of the present disclosure provides a light-emitting device including: an anode, a light-emitting layer and a cathode which are sequentially arranged in a stacking mode; and an electron transfer layer located between the light-emitting layer and the cathode and enables a difference value between the number of electrons reaching the light-emitting layer in unit time and the number of holes reaching the light-emitting layer in unit time to be smaller than a preset threshold range; where a material of the electron transfer layer includes: an inner core and a shell layer wrapping the inner core, and the number of electrons reaching the light-emitting layer in unit time is regulated and controlled by utilizing conductivity of the inner core and conductivity of the shell layer; when the number of the electrons reaching the light-emitting layer in unit time is greater than the number of the holes reaching the light-emitting layer in unit time, and the difference value between the number of the electrons reaching the light-emitting layer in unit time and the number of the holes reaching the light-emitting layer in unit time exceeds the preset threshold range, a particle size of the inner core is reduced and/or a thickness of the shell layer is increased, so that the difference value between the number of the electrons reaching the light-emitting layer in unit time and the number of the holes reaching the light-emitting layer in unit time is located in the preset threshold range, and balance of the holes and the electrons in the light-emitting layer is promoted; and when the number of the electrons reaching the light-emitting layer in unit time is smaller than the number of the holes reaching the light-emitting layer in unit time and the difference value between the number of the electrons reaching the light-emitting layer in unit time and the number of the holes reaching the light-emitting layer in unit time exceeds the preset threshold value range, the particle size of the inner core is increased and/or the thickness of the shell layer is reduced, so that the difference value between the number of the electrons reaching the light-emitting layer in unit time and the number of the holes reaching the light-emitting layer in unit time is located in the preset threshold range, and balance of the holes and the electrons in the light-emitting layer is promoted.

In some embodiments, a first filling layer is filled in a gap between the cathode and the electron transfer layer, a material of the first filling layer is the same as a material of the shell layer; and/or a second filling layer is filled in a gap between the electron transfer layer and the light-emitting layer, and a material of the second filling layer is the same as the material of the shell layer.

In some embodiments, at least a first filling layer is filled in a gap between the cathode and the shell layer, and a material of the first filling layer and a material of the shell layer are the same; and/or at least a second filling layer is filled in a gap between the shell layer and the light-emitting layer, and a material of the second filling layer and the material of the shell layer are the same.

In some embodiments, a thickness of the first filling layer is greater than or equal to a thickness of the electron transfer layer; or a thickness of the second filling layer is greater than or equal to a thickness of the electron transfer layer.

In some embodiments, a thickness of the second filling layer is greater than or equal to a thickness of the light-emitting layer.

In some embodiments, the first filling layer is a film layer treated by an annealing process, and a crystal phase of the first filling layer is the same as a crystal phase of the shell layer; and/or the second filling layer is a film layer treated by an annealing process, and a crystal phase of the second filling layer is the same as a crystal phase of the shell layer.

In some embodiments, a material of the shell layer is metal oxide.

In some embodiments, in the metal oxide, metal is in a highest valence state.

In some embodiments, the material of the shell layer includes one or a combination of:

$SnO_2$;
$Cu_2O$;
$Fe_2O_3$;
$TiO_2$;
$ZrO_2$;
$CoO$;
$WO_3$;
$In_2O_3$;
$Al_2O_3$; and
$Fe_3O_4$.

In some embodiments, a material of the inner core includes one or a combination of: ZnO, ZnMgO, ZnAlO, ZnLiO and ZnAgO.

In some embodiments, a thickness of the shell layer ranges from 0.1 nm to 100 nm; and the inner core is nanoparticles having a particle size of the inner core ranging from 0.1 nm to 100 nm.

In some embodiments, an electron transfer rate of a material of the shell layer is less than an electron transfer rate of a material of the inner core.

In some embodiments, a depth of an energy level of a bottom of a conduction band of the shell layer is greater than a depth of an energy level of a bottom of a conduction band of the inner core; and a depth of an energy level of a valence band maximum of the shell layer is greater than a depth of an energy level of a valence band maximum of the inner core.

In some embodiments, a band gap width of the shell layer is in negative correlation to the thickness of the shell layer.

In some embodiments, a depth of an energy level of a bottom of a conduction band of the shell layer is in negative correlation to the thickness of the shell layer.

In some embodiments, the light-emitting layer is an organic light-emitting layer; or the light-emitting layer is a quantum dot light-emitting layer.

In some embodiments, when the light-emitting layer is the quantum dot light-emitting layer, the light-emitting layer includes a plurality of light-emitting portions with quantum dots having different particle sizes, the second filling layer includes a plurality of regulation and control portions corresponding to the light-emitting portions, and a thickness of each regulation and control portion is in positive correlation to a corresponding quantum dot particle size.

In some embodiments, the light-emitting device further includes a substrate, where the anode, the light-emitting layer, the electron transfer layer and the cathode are sequentially arranged on one side of the substrate; or the cathode, the electron transfer layer, the light-emitting layer and the anode are sequentially arranged on one side of the substrate.

In some embodiments, a hole injection layer is further arranged between the anode and the light-emitting layer, and a hole transfer layer is further arranged between the hole injection layer and the light-emitting layer.

An embodiment of the present disclosure further provides a display apparatus which includes the light-emitting device provided by the embodiments of the present disclosure.

An embodiment of the present disclosure further provides a manufacturing method of the light-emitting device provided by the embodiments of the present disclosure, and the manufacturing method includes: forming the anode, the light-emitting layer, the electron transfer layer and the cathode sequentially arranged in a stacking mode; where forming the electron transfer layer includes: forming a first solution containing inner core particles; forming a second solution containing elements contained in a shell layer; and adding the second solution into the first solution, uniformly mixing the first solution with the second solution, and heating a mixture to form the inner core wrapped with the shell layer.

In some embodiments, the manufacturing method further includes: forming a first film between the cathode and the electron transfer layer, where a material of the first film is the same as a material of the shell layer.

In some embodiments, the manufacturing method further includes: forming a second film between the electron transfer layer and the light-emitting layer, where a material of the second film is the same as the material of the shell layer.

In some embodiments, after a second filling layer is formed and before the cathode is formed, the manufacturing method further includes: treating the first film, the electron transfer layer and the second film by using an annealing process so as to convert the first film into a first filling layer and convert the second film into the second filling layer.

DETAILED DESCRIPTION OF THE EMBODIMENTS

Figure 1:
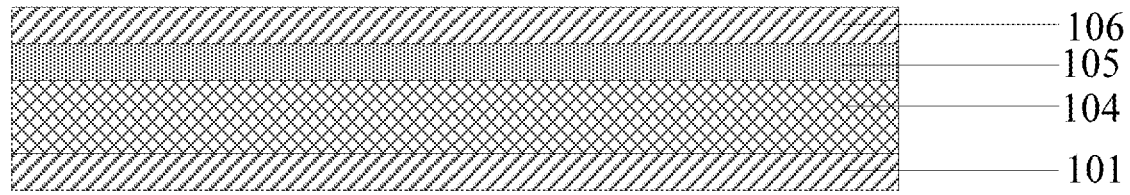
FIG. 1 is a first schematic structural diagram of a light-emitting device according to an embodiment of the present disclosure.

In order to make the objectives, technical solutions and advantages of the embodiments of the present disclosure more apparent, the technical solutions of the embodiments of the present disclosure will be described clearly and completely below with reference to the drawings of the embodiments of the present disclosure. Obviously, the described embodiments are only part of embodiments of the present disclosure, and are not all the embodiments. All the other embodiments obtained by those of ordinary skill in the art without creative labor belong to the protection scope of the present disclosure.

Unless defined otherwise, technical or scientific terms used herein shall have the ordinary meaning understood by those of ordinary skill in the art to which this disclosure belongs. The use of "first," "second," and the like in this disclosure is not intended to indicate any order, quantity, or importance, but rather is used to distinguish one element from another. The word "comprise" or "include", and the like, mean that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. "Upper", "lower", "left", "right", and the like are used only to indicate relative positional relationships, and when the absolute position of the object being described is changed, the relative positional relationships may also be changed accordingly.

To maintain the following description of the embodiments of the present disclosure clear and concise, a detailed description of known functions and known components is omitted from the present disclosure.

A quantum dot light-emitting device structure includes a hole injection layer (HI), a hole transfer layer (HT), a quantum dot light-emitting layer (QD) and an electron transfer layer (ET). The ET layer generally uses ZnO nanoparticles as an electron transfer material, and due to the fact that the ZnO nanoparticles have amphoteric properties, the ZnO nanoparticles are not resistant to water and oxygen and poor in stability, the problem that a brightness curve is abnormal in the aging process of the device occurs, and the service life of the quantum dot light-emitting device is shortened. Moreover, the electron transfer rate of the ZnO nanoparticles is usually greater than the hole transfer rate of a hole material, so that the quantum dot light-emitting device is unbalanced in carrier injection, an exciton recombination region is deflected to the HT layer, and the performance of the device is reduced. Meanwhile, surface defects of the ZnO nanoparticles have a quenching effect on excitons, the performance of the device is further reduced, the ZnO nanoparticles are used as an electron transfer material, the hole transfer rate is lower than the electron transfer rate of the ZnO nanoparticles, carrier injection of the light-emitting device is unbalanced, and the light-emitting efficiency of the device is reduced.

Figure 2:
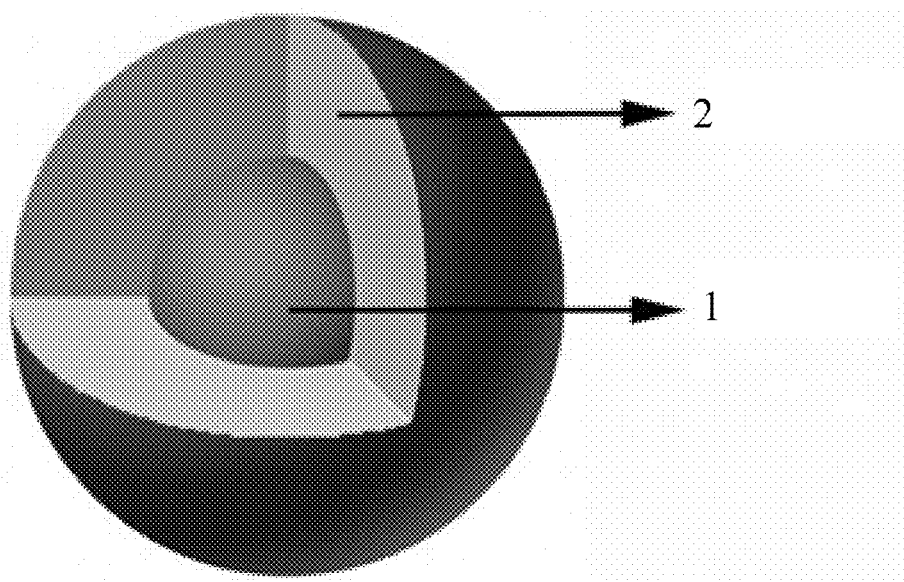
FIG. 2 is a schematic structural diagram of a light-emitting device according to an embodiment of the present disclosure.

In view of this, referring to FIG. 1 and FIG. 2, embodiments of the present disclosure provide a light-emitting device including: an anode 101, a light-emitting layer 104 and a cathode 106 which are sequentially arranged in a stacking mode, and an electron transfer layer 105 which is located between the light-emitting layer 104 and the cathode 106. The electron transfer layer 105 is configured to enable a difference value between the number of electrons reaching the light-emitting layer 104 in unit time and the number of holes reaching the light-emitting layer 104 in unit time to be located in a preset threshold range. In some embodiments, the preset threshold may be a numerical value interval, and when the difference value between the number of the electrons reaching the light-emitting layer 104 in unit time and the number of the holes reaching the light-emitting layer 104 in unit time is located in the numerical value interval, the light-emitting efficiency of the light-emitting device meets the preset requirements.

A material of the electron transfer layer 105 includes: an inner core 1 and a shell layer 2 wrapping the inner core 1. By utilizing conductivity of the inner core 1 and conductivity of the shell layer 2, the rate of the electrons transferred from the cathode 106 to the light-emitting layer 104 can be regulated and controlled.

When the number of the electrons reaching the light-emitting layer 104 in unit time is greater than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, a particle size of the inner core 1 is reduced and/or a thickness of the shell layer 2 is increased, so that the difference value between the number of the electrons reaching the light-emitting layer 104 in unit time and the number of the holes reaching the light-emitting layer 104 in unit time is located in the preset threshold range.

When the number of the electrons reaching the light-emitting layer 104 in unit time is smaller than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, the particle size of the inner core 1 is increased and/or the thickness of the shell layer 2 is reduced, so that the difference value between the number of the electrons reaching the light-emitting layer 104 in unit time and the number of the holes reaching the light-emitting layer 104 in unit time is located in the preset threshold range. The shell layer 2 may be used for encapsulating the inner core 1 so as to isolate external water and oxygen.

The light-emitting device provided by the embodiment of the present disclosure includes the electron transfer layer 105. The material of the electron transfer layer 105 includes: the inner core and the shell layer wrapping the inner core. The shell layer encapsulates the inner core to isolate external water and oxygen, so that the chemical stability of the inner core may be improved, the water and oxygen resistance of the light-emitting device is improved, the service life of the light-emitting device is prolonged, moreover, the shell layer may passivate surface defects of the inner core, the problem that the defects of the surface of the inner core may quench light emitted from the light-emitting layer in the light-emitting device when the light-emitting device only with the inner core is applied to a light-emitting device is solved, meanwhile, the shell layer may reduce the energy level barrier of the electrons migrating from the electron transfer layer to the light-emitting layer, injection of the electrons is better facilitated, the light-emitting device may have lower turn-on voltage and higher current density, and the light-emitting device has better light-emitting performance. Moreover, balance of carriers in the light-emitting device may be controlled by regulating and controlling the inner core 1 and the shell layer 2, and when the number of the electrons reaching the light-emitting layer 104 in unit time is larger than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, the particle size of the inner core is reduced and/or the thickness of the shell layer is increased to promote balance of the holes and the electrons in the light-emitting layer 104; and when the number of the electrons reaching the light-emitting layer 104 in unit time is smaller than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, the particle size of the inner core is increased and/or the thickness of the shell layer is reduced to promote balance of the holes and the electrons in the light-emitting layer 104.

In some embodiments, when the number of the electrons reaching the light-emitting layer 104 in unit time is greater than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, an energy level of a bottom of a conduction band of the electron transfer layer should be shallower, so that the barrier of the electrons injected into the electron transfer layer from the cathode is increased, the number of the electrons entering the electron transfer layer from the cathode is reduced, and the number of the electrons reaching the light-emitting layer 104 in unit time and the number of the holes reaching the light-emitting layer 104 in unit time are finally the same. In some embodiments, the particle size of synthesized inner core nanoparticles may be reduced to achieve the purpose of reducing the energy level of the bottom of the conduction band of the electron transfer layer.

In some embodiments, when the number of the electrons reaching the light-emitting layer 104 in unit time is greater than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, the electron transfer rate may also be reduced, and the number of the electrons reaching the light-emitting layer 104 in unit time and the number of the holes reaching the light-emitting layer 104 in unit time are finally the same. In some embodiments, the thickness of the shell layer may be properly increased to achieve a reduced electron transfer rate (namely, the electron transfer rate in the shell layer 2 is less than the electron transfer rate in the inner core 1). Of course, considering that the energy level of the bottom of the conduction band of the electron transfer layer is close to the cathode when the thickness of the shell layer 2 is increased, the energy level barrier may be lowered, and the quantity of injected electrons may be increased, and in some embodiments the optimal thickness of the shell layer 2 may be obtained by designing light-emitting devices with shell layers 2 in different thicknesses.

In some embodiments, when the number of the electrons reaching the light-emitting layer 104 in unit time is smaller than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, the energy level of the bottom of the conduction band of the electron transfer layer should be deepened, so that the barrier of the electrons injected into the electron transfer layer from the cathode is reduced, the number of the electrons entering the electron transfer layer from the cathode is further increased, and the number of the electrons reaching the light-emitting layer 104 in unit time and the number of the holes reaching the light-emitting layer 104 in unit time are finally the same. In some embodiments, the particle size of the synthesized inner core nanoparticles may be increased to achieve the purpose of deepening the energy level of the bottom of the conduction band of the electron transfer layer.

In some embodiments, when the number of the electrons reaching the light-emitting layer 104 in unit time is smaller than the number of the holes reaching the light-emitting layer 104 in unit time and the difference value between the number of the electrons reaching the light-emitting layer 104 in unit time and the number of the holes reaching the light-emitting layer 104 in unit time exceeds the preset threshold range, the electron transfer rate may also be increased, and the number of the electrons reaching the light-emitting layer 104 in unit time and the number of the holes reaching the light-emitting layer 104 in unit time are finally the same. In some embodiments, the thickness of the shell layer may be appropriately reduced to achieve an improved electron transfer rate.

In some embodiments, the electron transfer layer in the embodiment of the present disclosure may be applied into an organic light-emitting device, that is, the light-emitting layer 104 may be an organic light-emitting layer. In some embodiments, the light-emitting device according to the embodiment of the present disclosure may also be applied to a quantum dot light-emitting device, that is, the light-emitting layer 104 may be a quantum dot light-emitting layer.

Figure 3:
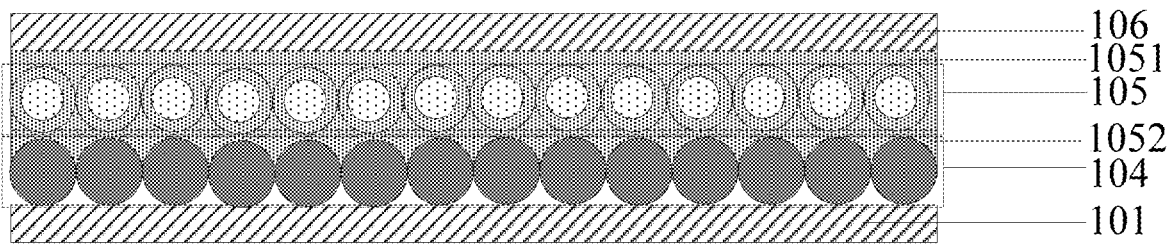
FIG. 3 is a second schematic structural diagram of a light-emitting device according to an embodiment of the present disclosure.

In some embodiments, referring to FIG. 3, a gap between the cathode 106 and the shell layer 2 is also filled with a first filling layer 1051 at least, and a material of the first filling layer 1051 is the same as the material of the shell layer 2. In some embodiments, filling positions of the first filling layer 1051 may be different according to different manufacturing conditions, for example, in combination with FIG. 3, if the first filling layer 1051 is formed in a magnetron sputtering mode, the reaching depth of the first filling layer 1051 is limited, only a gap between the side, facing the cathode 106, of the shell layer 2 and the cathode 106 may be filled, if the first filling layer 1051 is formed in a liquid spin-coating mode, the first filling layer 1051 may penetrate through the gap below the shell layer 2, and the gap in the side, facing away from the cathode 106, of the shell layer 2 is partially or completely filled. In some embodiments, the light-emitting layer 104 may be a quantum dot light-emitting layer.

According to a traditional device structure, a ZnO nanoparticle electron transfer material and a quantum dot light-emitting material are nano materials, holes and gap defects may be generated due to the particle size problem of the materials in the film deposition process, the electrons may only be transferred through a contact surface of the ZnO nanoparticle electron transfer material and the quantum dot light-emitting material in the working process of the device, and the light-emitting surface loses uniformity, meanwhile, point discharge is easily caused, or local temperature is sharply raised to cause defective pixels, the service life of the device is shortened.

In the embodiments of the present disclosure, the gap between the cathode 106 and the electron transfer layer 105 is further filled with the first filling layer 1051, and the material of the first filling layer 1051 is the same as the material of the shell layer 2, gaps and defects on the surfaces of the core/shell structure nanoparticles in the electron transfer layer may be filled, the uniformity and stability of transfer of carriers are improved, local point discharge is prevented, the surface of the core/shell structure may be flattened, subsequent process film formation is facilitated, the interface problem is improved, the interface stability is improved, and the core/shell structure nanoparticles may be fully wrapped by the material of the shell layer, so that the stability of the nanoparticles is improved; moreover, the first filling layer and the shell layer of the core/shell structure nanoparticles are made of the same material, after high-temperature annealing and recrystallization, a uniform crystal phase can be formed, interface defects are fewer, and different materials may generate interface stress and increase interface defects due to lattice mismatch, and meanwhile, the flat surface is beneficial to deposition of a subsequent film layer (for example, a cathode), and a uniform contact interface is formed by the flat surface and the subsequent film layer.

In some embodiments, in combination with FIG. 3, the gap between the shell layer 2 and the light-emitting layer 104 is further filled with a second filling layer 1052 at least, and a material of the second filling layer 1052 is the same as the material of the shell layer 2. In some embodiments, the light-emitting layer 104 may be a quantum dot light-emitting layer. Similarly, filling positions of the second filling layer 1052 may be different according to different manufacturing conditions, for example, in combination with FIG. 2, if the second filling layer 1052 is formed by a magnetron sputtering mode, the reaching depth of the second filling layer 1052 is limited, and only the gap between the side, facing the light-emitting layer 104, of the shell layer 2 and the light-emitting layer 104 may be filled with the second filling layer 1052, if the second filling layer 1052 is formed in a liquid spin-coating mode, the second filling layer 1052 may penetrate through the gap below the light-emitting quantum dots, and the gap in the side, facing the anode 101, of the light-emitting quantum dots is also partially or completely filled. In the embodiments of the present disclosure, the film layers (the first filling layer 1051 and the second filling layer 1052) with the same material as that of the shell layer are formed on the shell layer of the core/shell structure nanoparticles to form a uniform crystal phase, so that the interface defects may be reduced, the inner core is fully wrapped, and the stability of the inner core is enhanced.

In some embodiments, a thickness of the first filling layer 1051 is greater than or equal to the thickness of the electron transfer layer 105; or a thickness of the second filling layer 1052 is greater than or equal to the thickness of the electron transfer layer 105. In some embodiments, the thickness of the first filling layer 1051 is greater than or equal to the thickness of the electron transfer layer 105 so that the first filling layer 1051 can be suitable for a conventional light-emitting device; the anode 101, the light-emitting layer 104, the electron transfer layer 105 and the cathode 106 are sequentially formed during manufacturing, namely, the electron transfer layer 105 is formed first and then filled with the first filling layer 1051 so that the thickness of the first filling layer 1051 is greater than or equal to the thickness of the electron transfer layer 105, the first filling layer 1051 may be flattened, and then an electrode is made. In some embodiments, the thickness of the second filling layer 1052 is greater than or equal to the thickness of the electron transfer layer 105, the second filling layer 1052 may be suitable for an inverted device, the cathode 106, the electron transfer layer 105, the light-emitting layer 104 and the anode 101 are formed sequentially, namely, the electron transfer layer 105 is first made and then filled with the second filling layer 1052 to enable the thickness of the second filling layer 1052 to be greater than or equal to the thickness of the electron transfer layer 105, the second filling layer 1052 may be flattened, and then the light-emitting layer 104 is made.

In some embodiments, the thickness of the second filling layer 1052 is greater than or equal to the thickness of the light-emitting layer 104. The situation is applicable to a conventional structure, namely, the light-emitting layer 104 (which specifically may be a quantum dot light-emitting layer) is made first, then the second filling layer 1052 is made, and by enabling the thickness of the second filling layer 1052 to be greater than or equal to the thickness of the light-emitting layer 104, the surface of the quantum dot light-emitting layer may be flattened, subsequent manufacturing of the electron transfer layer 105 is facilitated.

Figure 4:
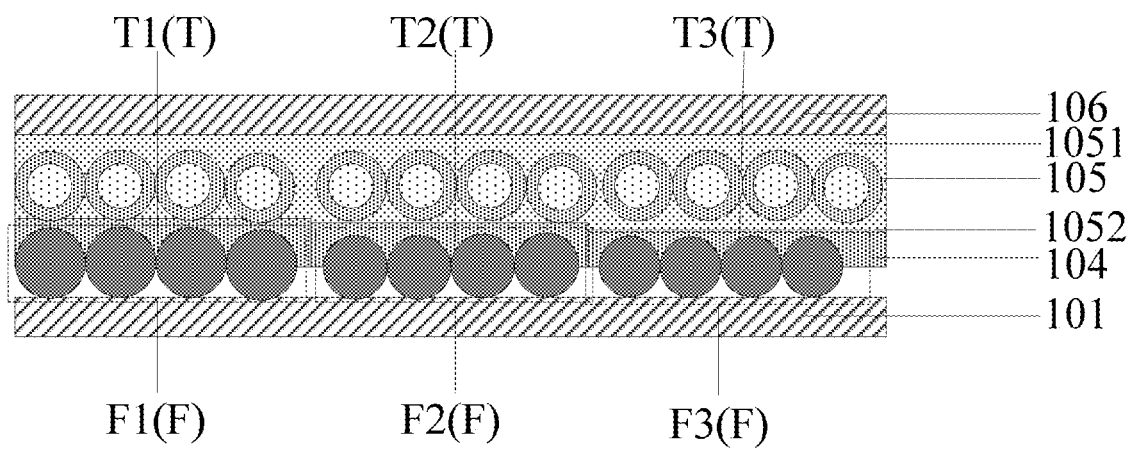
FIG. 4 is a third schematic structural diagram of a light-emitting device according to an embodiment of the present disclosure.

In some embodiments, referring to FIG. 4, the light-emitting layer 104 includes a plurality of light-emitting portions F having quantum dots with different particle sizes, the second filling layer 1052 includes a plurality of regulation and control portions T corresponding to the light-emitting portions F, and the thickness of the regulation and control portions T is in positive correlation to the particle sizes of the corresponding quantum dots. In some embodiments, the light-emitting layer 104 includes a first light-emitting portion F1 having quantum dots in a first particle size, a second light-emitting portion F2 having quantum dots in a second particle size, and a third light-emitting portion F3 having quantum dots in a third particle size, where a range of the first particle size is larger than a range of the second particle size, and the range of the second particle size is larger than a range of the third particle size. Correspondingly, the regulation and control portions T include a first regulation and control portion T1 corresponding to the first light-emitting portion F1, a second regulation and control portion T2 corresponding to the second light-emitting portion F2 and a third regulation and control portion T3 corresponding to the third light-emitting portion F3; a thickness of the first regulation and control portion T1 is larger than a thickness of the second regulation and control portion T2, and the thickness of the second regulation and control portion T2 is larger than a thickness of the third regulation and control portion T3. In some embodiments, quantum dots in different particle sizes may correspond to quantum dots having different light-emitting colors, for example, quantum dots in the first particle size may correspond to quantum dots emitting red light, quantum dots in the second particle size may correspond to quantum dots emitting green light, and quantum dots in the third particle size may correspond to quantum dots emitting blue light.

In some embodiments, in the design process of the light-emitting device, a first filling layer 1051 with the thickness of 5 nm to 10 nm and a second filling layer 1052 with the thickness of 5 nm to 10 nm are respectively prepared from the material of the shell layer on two sides of the core/shell structure nanoparticles. In some embodiments, the thickness of the second filling layer 1052 is determined by the size of quantum dots of the quantum dot light-emitting layer, for example, when the particle size of red quantum dots is 8 nm, the roughness is about 8 nm due to an interface gap caused by quantum dot accumulation, and at the moment, the material of the shell layer with the thickness of 10 nm needs to be deposited to fill the gaps in the surfaces of the quantum dots and enable the interface to be flattened; when the particle size of the green quantum dots is 5 nm, the roughness is about 5 nm due to an interface gap caused by quantum dot accumulation, and at the moment, a layer of the material of the shell layer with the thickness of 8 nm needs to be deposited to fill the gaps in the surfaces of the quantum dots and enable the interface to be flattened; and when the particle size of the blue quantum dots is 2 nm, the roughness is about 2 nm due to an interface gap caused by quantum dot accumulation, and at the moment, a layer of the material of the shell layer with the thickness of 5 nm needs to be deposited to fill the gaps in the surfaces of the quantum dots and enable the interface to be flattened.

In some embodiments, the first filling layer 1051 is a film layer treated by an annealing process, so that the crystal phase of the first filling layer 1051 is the same as the crystal phase of the shell layer 2; and the second filling layer 1052 is a film layer treated by an annealing process, so that the crystal phase of the second filling layer 1052 is the same as the crystal phase of the shell layer 2. In some embodiments, the first filling layer 1051 is a film layer treated by an annealing process, and the second filling layer 1052 is a film layer treated by an annealing process, after high-temperature annealing and recrystallization, a uniform crystal phase can be formed, interface defects are fewer, different materials generate interface stress due to lattice mismatch, and interface defects are increased.

Figure 5:
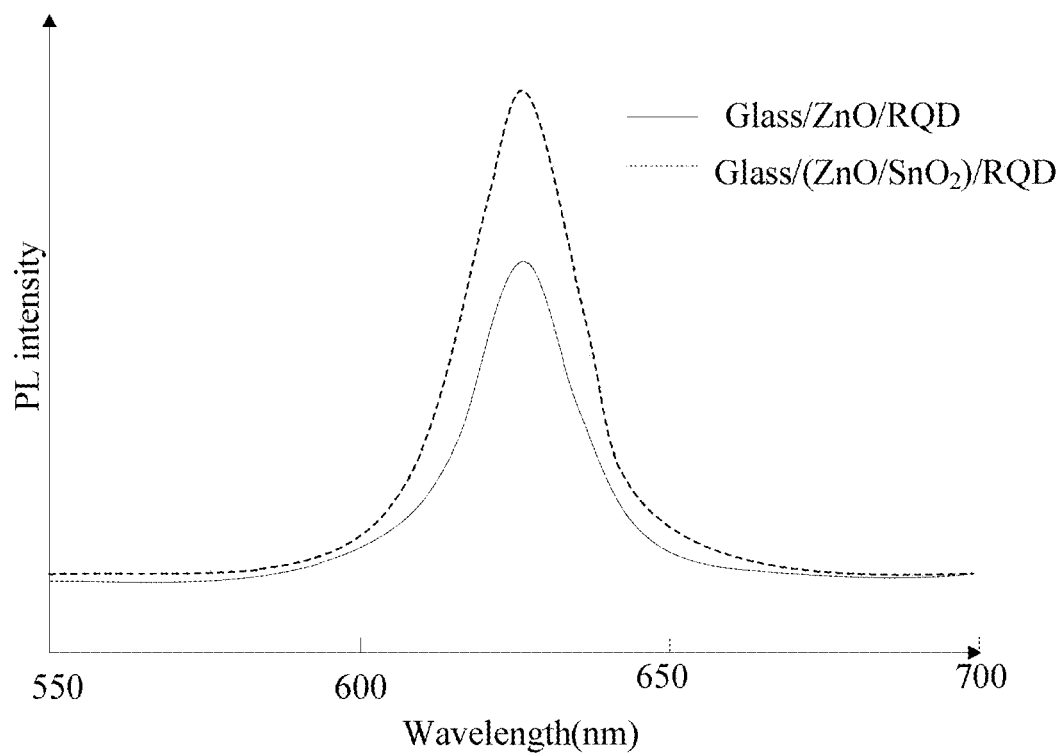
FIG. 5 is a schematic diagram illustrating a comparison of influences of a light-emitting device including a shell layer and a light-emitting device without a shell layer on quantum dot light emission according to an embodiment of the present disclosure.

In some embodiments, as shown in FIG. 5, a photoluminescence spectrum of a structure of a first film layer at 600 nm to 650 nm is higher than a photoluminescence spectrum of a structure of a second film layer at 600 nm to 650 nm, where the structure of the first film layer is a quantum dot film layer covered with the light-emitting device provided by the embodiments of the present disclosure (for example, the structure is Glass/(ZnO/SnO$_2$)/RQD, where ZnO serves as the inner core 1 of the light-emitting device, SnO$_2$ serves as the shell layer 2 of the light-emitting device, and RQD is a red quantum dot film layer). The structure of the second film layer is a quantum dot film layer only covered with the inner core 1 (for example, the structure is Glass/ZnO/RQD, ZnO serves as the inner core 1 of the light-emitting device, and RQD is a red quantum dot film layer), due to existence of defects on the surface of the inner core 1 (for example, zinc oxide), light emitted from the quantum dot light-emitting layer formed by the light-emitting device may be quenched, and by wrapping the inner core 1 with the shell layer 2, surface defects of the inner core may be passivated, and the light-emitting intensity of the quantum dot light-emitting layer may be improved.

In some embodiments, the material of the shell layer 2 is metal oxide. In the embodiments of the present disclosure, the material of the shell layer 2 is the metal oxide, and compared with a light-emitting device wrapped with other types of materials (such as organic materials), the light-emitting device has better water resistance and oxygen resistance and better stability, so that the service life of the light-emitting device is prolonged. In some embodiments, water and oxygen resistance may be understood that the light-emitting device is not subjected to a chemical reaction with water or oxygen, or the rate of carrying out a chemical reaction on the light-emitting device and water or oxygen is reduced.

In some embodiments, in the metal oxide, the metal is in the highest valence state. For example, the metal oxide is Fe$_2$O$_3$, where Fe is in the highest valence state in Fe$_2$O$_3$. In the embodiments of the present disclosure, in the shell layer 2 of the metal oxide, the metal is in the highest valence state, so that the light-emitting device has relatively stable chemical performance on the whole, and further has better water and oxygen resistance. Specifically, in the metal oxide, the metal is in the highest valence state, it is understood that the highest valence state means the largest number of electrons that the metal can lose in the metal oxide.

In some embodiments, the material of the shell layer 2 includes one or a combination of:
  SnO$_2$;
  Cu$_2$O;
  Fe$_2$O$_3$;
  TiO$_2$;
  ZrO$_2$;
  CoO;
  WO$_3$;
  In$_2$O$_3$;
  Al$_2$O$_3$; and
  Fe$_3$O$_4$.

In some embodiments, the essence of improving the water and oxygen resistance of the inner core is to isolate contact between water and oxygen and the inner core, so that the metal oxide which is not in the highest oxidation state can also improve the water and oxygen resistance of the inner core, and the metal oxide which is not in the highest oxidation state may also absorb part of water and oxygen and enhance the water and oxygen resistance of the inner core.

Figure 6:
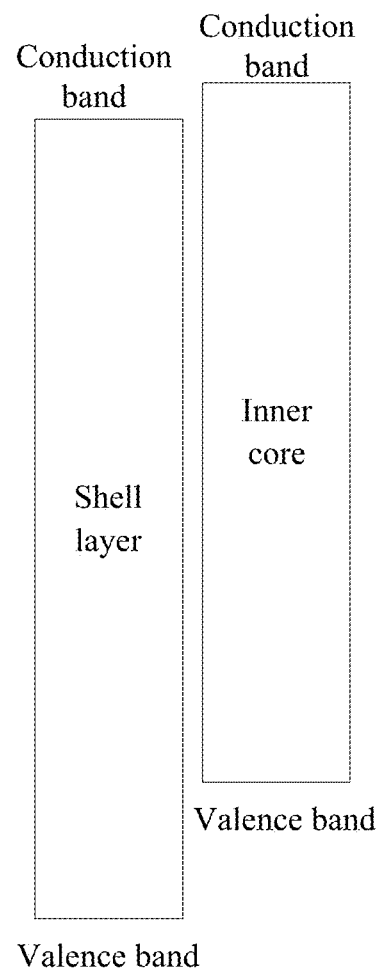
FIG. 6 is a schematic diagram illustrating an energy level of a shell layer and an energy level of an inner core according to an embodiment of the present disclosure.

In some embodiments, referring to FIG. 6, the depth of the energy level of the bottom of the conduction band of the shell layer 2 is greater than the depth of the energy level of the bottom of the conduction band of the inner core 1. In some embodiments, the depth of the energy level of the bottom of conduction band of the shell layer 2 is greater than the depth of the energy level of the bottom of conduction band of the inner core 1, when the light-emitting device is used in a light-emitting device, the energy level barrier of electrons migrating from the electron transfer layer to the light-emitting layer may be reduced, injection of the electrons is better facilitated, the light-emitting device may have lower turn-on voltage and higher current density, and thus, the light-emitting device has better light-emitting performance.

In some embodiments, referring to FIG. 6, the depth of the energy level of the valence band maximum of the shell layer 2 is greater than the depth of the energy level of the valence band maximum of the inner core 1. In some embodiments, the depth of the energy level of the valence band maximum of the shell layer 2 is greater than the depth of the energy level of the valence band maximum of the inner core 1, the electron transfer layer has the capacity of blocking holes, and when the electron transfer layer is applied into the light-emitting device, the holes may be limited in the light-emitting layer, leakage current is reduced, and the radiation recombination efficiency of the holes and the electrons in the light-emitting layer is improved.

Figure 7:
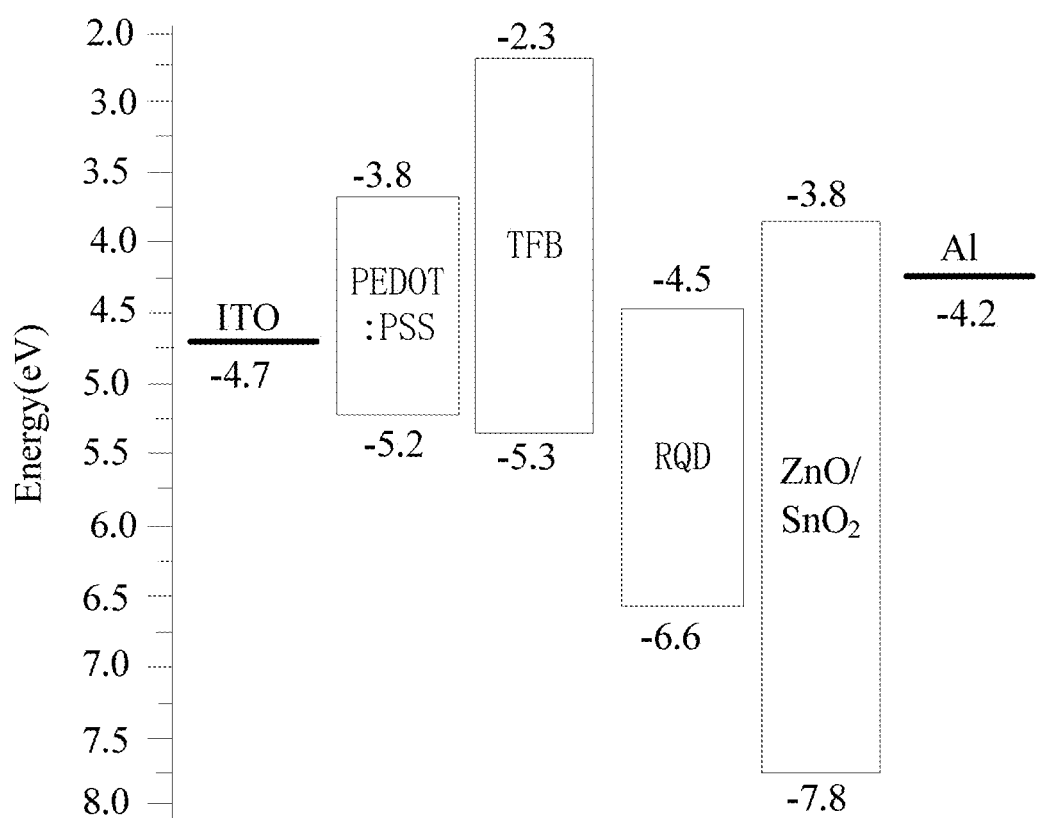
FIG. 7 is a schematic diagram illustrating an energy level of a quantum dot light-emitting device according to an embodiment of the present disclosure.
Figure 8:
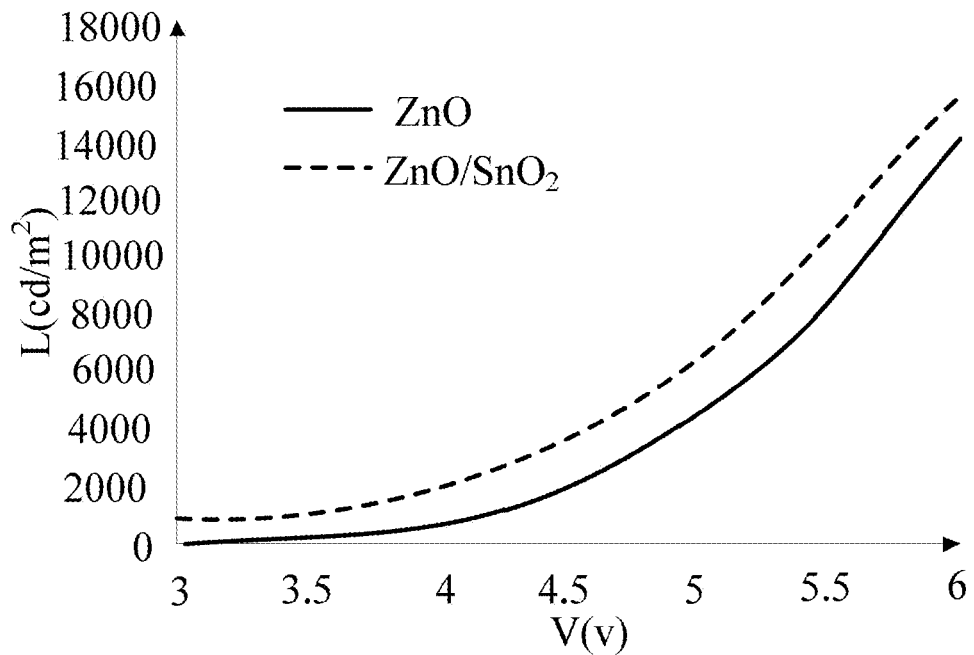
FIG. 8 is a schematic diagram illustrating luminance of a quantum dot light-emitting device according to an embodiment of the present disclosure.
Figure 9:
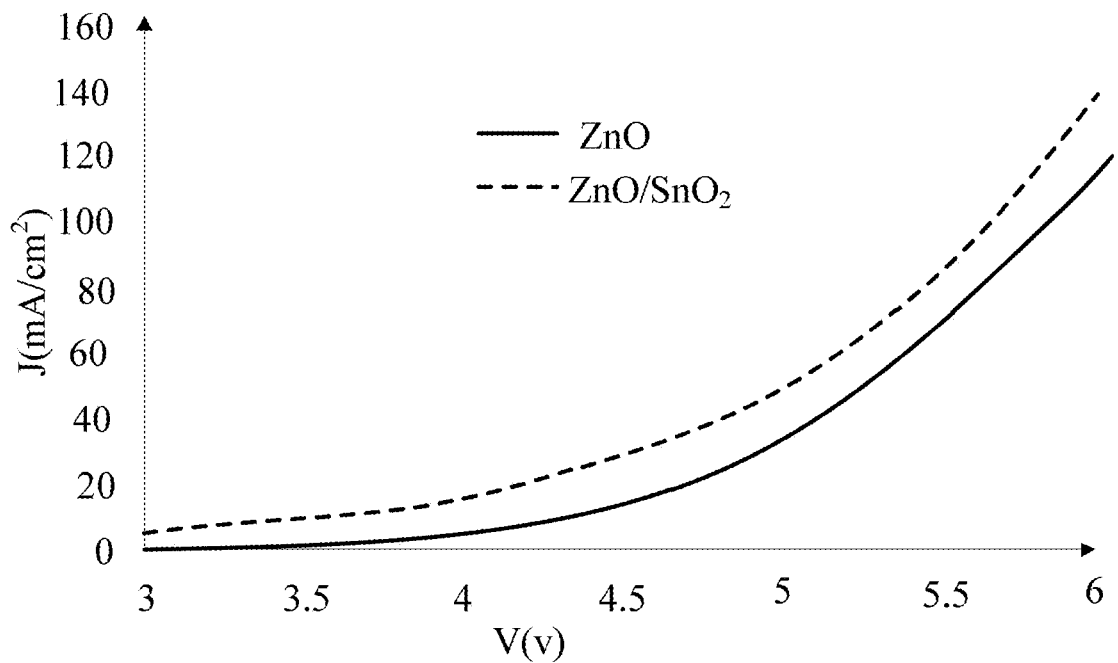
FIG. 9 is a schematic diagram illustrating current density of a quantum dot light-emitting device according to an embodiment of the present disclosure.

In some embodiments, referring to FIG. 7, FIG. 8 and FIG. 9, where FIG. 7 is a schematic structural diagram illustrating an energy level of the light-emitting device used as a quantum dot light-emitting device according to the embodiments of the present disclosure, FIG. 8 is a schematic diagram illustrating luminance of the light-emitting device under different voltages, and FIG. 9 is a schematic diagram illustrating current density of the light-emitting device under different voltages.

A specific quantum dot light-emitting device structure (shown as dotted lines in FIG. 8 and FIG. 9) includes an anode (where the material of the anode may be indium tin oxide (ITO)), a hole injection layer (where the material of the hole injection layer may be poly(3,4-ethylenedioxythiophene)-poly(styrenesulfonate), PEDOT:PSS), a hole transfer layer (where the material of the hole transfer layer may be TFB), a quantum dot light-emitting layer (of which the material may be a red quantum dot light-emitting layer RQD emitting red light), an electron transfer layer (of which the material may be ZnO wrapped with SnO$_2$) and a cathode (of which the material may be Al) which are sequentially arranged on one side of the substrate. In order to more clearly illustrate the improved performance of the light-emitting device provided by the embodiments of the present disclosure, a contrast device (shown as a solid line in FIG. 8 and FIG. 9) is manufactured for comparison, the structure of the contrast device is the same as the structure of the quantum dot light-emitting device provided by the present disclosure in other aspects except that the electron transfer layer only uses ZnO, that is, the structure of the contrast device may include an anode (of which the material may be indium tin oxide (ITO)), a hole injection layer (of which the material may be poly(3,4-ethylenedioxythiophene)-poly(styrenesulfonate), PEDOT:PSS), a hole transfer layer (of which the material may be TFB), a quantum dot light-emitting layer (of which the material may be a red quantum dot light-emitting layer RQD emitting red light), an electron transfer layer (of which the material may be ZnO) and a cathode (of which the material may be Al) which are sequentially arranged on one side of the substrate. From FIG. 4, FIG. 5 and FIG. 6, it can be known that the synthesized core-shell structure $ZnO/SnO_2$ nanoparticles have conduction bands (−3.8 eV) and valence bands (−7.8 eV), the conduction bands and an Al electrode only have an energy level difference of 0.4 eV, and thus, the electrons are favorably injected into a $ZnO/SnO_2$ layer; owing to the LUMO (−4.5 eV) higher than that of the RQD, transfer of the electrons to the RQD layer is facilitated; meanwhile, the difference between the energy level of the valence band maximum (−7.8 eV) of the $ZnO/SnO_2$ nanoparticles and the energy level of HOMO of the RQD reaches 1.2 eV, the $ZnO/SnO_2$ nanoparticles have the capacity of blocking holes, the holes are limited on a QD layer, leakage current is reduced, radiation recombination efficiency of the holes and the electrons on the RQD layer is improved, through the light-emitting device provided by the embodiment of the present disclosure, when the light-emitting device is used in a light-emitting device, the energy level barrier of the electrons migrating from the electron transfer layer to the light-emitting layer may be reduced by the shell layer with a wrapping function, injection of the electrons is better facilitated, the light-emitting device may have lower turn-on voltage and higher current density, and the light-emitting device has better light-emitting performance.

In some embodiments, the thickness of the shell layer 2 is in negative correlation to a band gap width of the shell layer 2, and the thickness of the shell layer 2 is in negative correlation to the energy level of the bottom of the conduction band of the shell layer 2. That is, along with increasing of the thickness of the shell layer 2, the band gap width of the shell layer 2 becomes narrower, and the energy level of the bottom of conduction band is reduced. In some embodiments, the thickness of the shell layer may be controlled according to the reaction time when the shell layer 2 is made, and the longer the reaction time is, the greater the thickness of the shell layer 2 is, for example, the thickness of the shell layer 2 is about 4 nm if the reaction lasts for 20 h; and if the reaction lasts for 10 h, the thickness of the shell layer 2 is about 2 nm. In some embodiments, the thickness of the shell layer 2 ranges from 0.1 nm to 100 nm. It needs to be noted that the thickness of the shell layer 2 may specifically be understood as the thickness of the shell layer 2 in the radial direction of the inner core 1.

In some embodiments, the inner core 1 is nanoparticles. In some embodiments, the materials of the inner core 1 may be one or a combination of ZnO, ZnMgO, ZnAlO, ZnLiO and ZnAgO. In some embodiments, the particle size of the inner core 1 is in negative correlation to the band gap width of the inner core 1. That is, along with reduction of the particle size of the inner core nanoparticles, the band gap width becomes wider, and the bottom of the conduction band is increased. In some embodiments, the heat preservation temperature and the reaction temperature of a precursor solution may be controlled in the process of synthesizing the inner core nanoparticles to control the particle size of the finally synthesized inner core nanoparticles, the higher the temperature is, the larger the particle size of the synthesized the inner core nanoparticles is. For example, the particle size of the synthesized ZnO nanoparticles at 0° C. is about 2.5 nm; the particle size of the synthesized ZnO nanoparticles at 25° C. is about 4.1 nm; and the particle size of the synthesized ZnO nanoparticles at 50° C. is about 5.3 nm, and the particle size of the inner core 1 ranges from 0.1 nm to 100 nm.

The correlation between the properties of the inner core and the shell layer which are synthesized under different conditions is given below through Table 1 and Table 2.

TABLE 1 particle size, conduction band, valence band and band gap of the ZnO nanoparticle inner core synthesized at different temperatures:

| Temperature (° e) | Particle size (nm) | Conduction band (eV) | Valence band (eV) | Band gap (eV) |
|---|---|---|---|---|
| 0 | 2.5 | −3.6 | −7.33 | 3.73 |
| 25 | 4.1 | −3.7 | −7.28 | 3.58 |
| 50 | 5.3 | −3.8 | −7.25 | 3.45 |

TABLE 2 thickness, conduction band, valence band and band gap of the core-shell structure ZnO (2.5 nm)/$SnO_2$ nanoparticle $SnO_2$ shell layer synthesized at different reaction times:

| Time (h) | Thickness (nm) | Conduction band (eV) | Valence band (eV) | Band gap (eV) |
|---|---|---|---|---|
| 10 | 2 | −3.7 | −7.9 | 4.2 |
| 20 | 4 | −3.9 | −7.9 | 4 |

Figure 10:
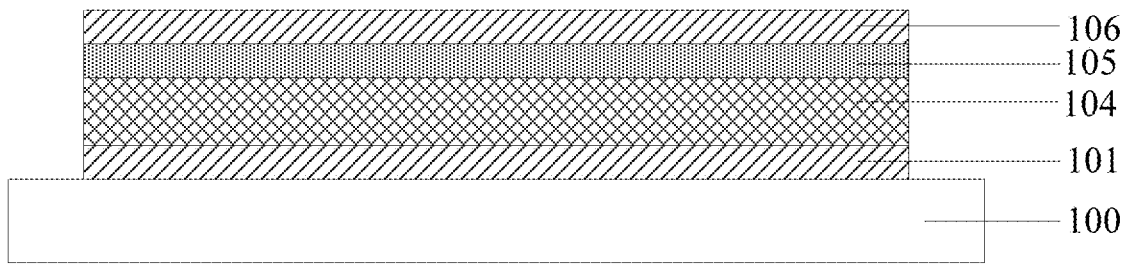
FIG. 10 is a fourth schematic structural diagram of a light-emitting device according to an embodiment of the present disclosure.

In some embodiments, referring to FIG. 10, the light-emitting device provided by the embodiments of the present disclosure may be of a conventional structure, namely, the light-emitting device further includes the substrate 100, where the anode 101, the light-emitting layer 104, the electron transfer layer 105 and the cathode 106 are sequentially arranged on one side of the substrate 100.

Figure 11:
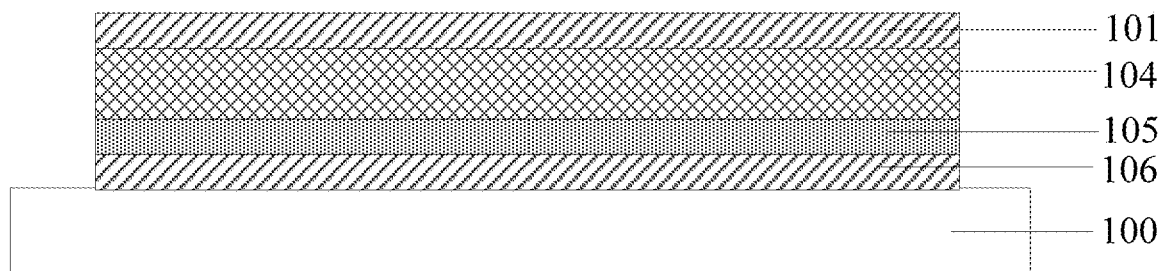
FIG. 11 is a fifth schematic structural diagram of a light-emitting device according to an embodiment of the present disclosure.

In some embodiments, referring to FIG. 11, the light-emitting device provided by the embodiments of the present disclosure may be of an inverted structure, and the light-emitting device further includes the substrate 100, where the cathode 106, the electron transfer layer 105, the light-emitting layer 104 and the anode 101 are sequentially arranged on one side of the substrate 100.

Figure 12:
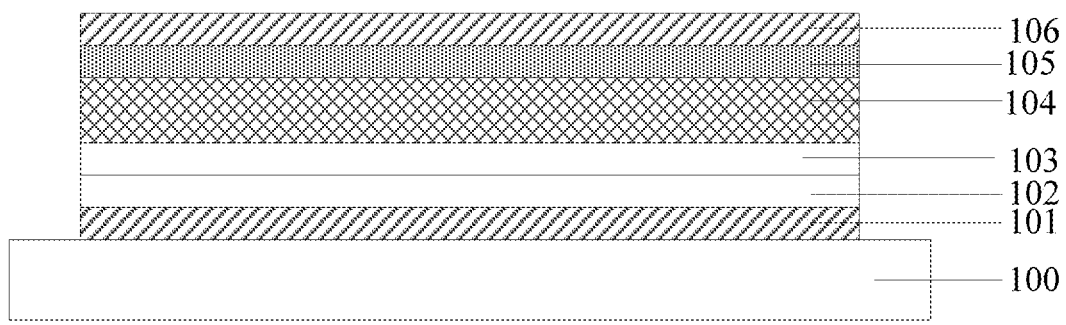
FIG. 12 is a sixth schematic structural diagram of a light-emitting device according to an embodiment of the present disclosure.
Figure 13:
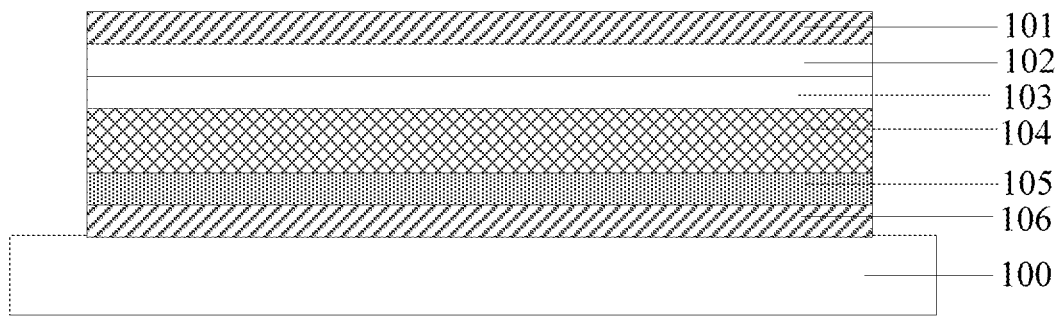
FIG. 13 is a seventh schematic structural diagram of a light-emitting device according to an embodiment of the present disclosure.

In some embodiments, referring to FIG. 12 and FIG. 13, a hole injection layer 102 is further arranged between the anode 101 and the light-emitting layer 104, and a hole transfer layer 103 is further arranged between the hole injection layer 102 and the light-emitting layer 104.

In some embodiments, the material of the quantum dot light-emitting layer may include one or a combination of following elements:
CdS;
CdSe;
ZnSe;
InP;
PbS;
$CsPbCl_3$;
$CsPbBr_3$;
$CsPhI_3$;
CdS wrapped with ZnS;
CdSe wrapped with ZnS;
InP wrapped with ZnS;
PbS wrapped with ZnS;
$CsPbCl_3$ wrapped with ZnS;
$CsPbBr_3$ wrapped with ZnS; and
$CsPhI_3$ wrapped with ZnS.

An embodiment of the present disclosure further provides a display apparatus which includes the light-emitting device provided by the embodiments of the present disclosure.

Figure 14:
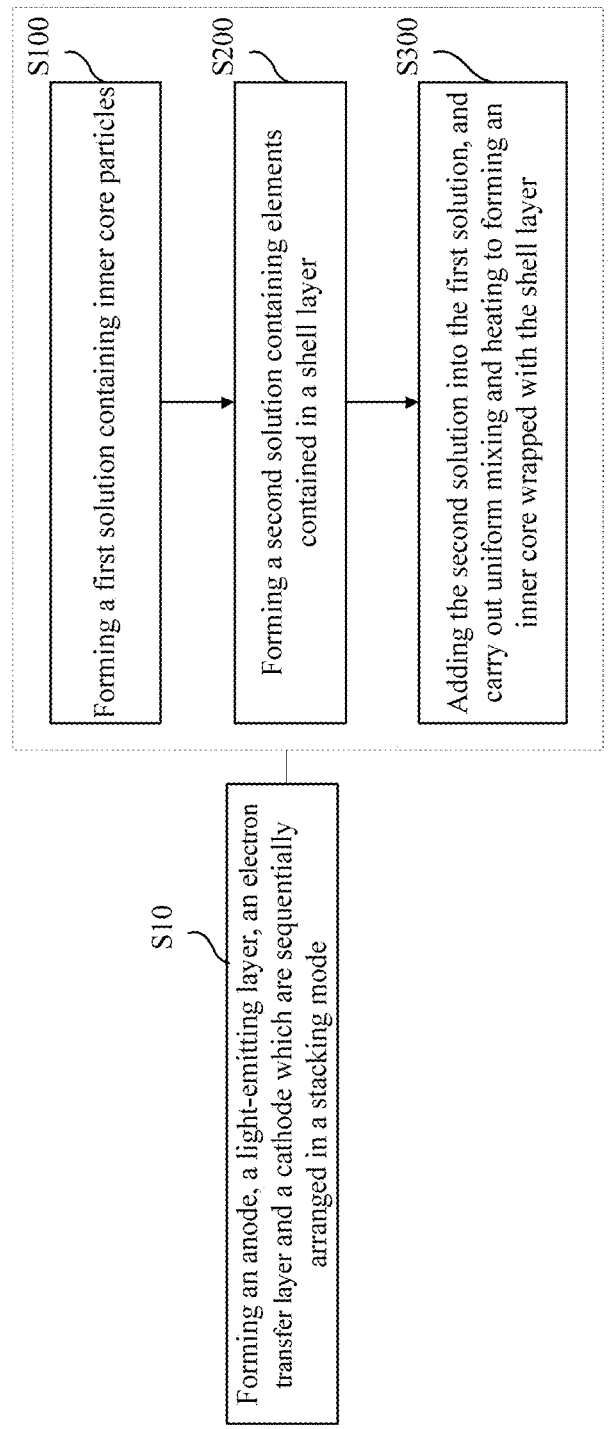
FIG. 14 is a schematic diagram illustrating manufacturing of a light-emitting device according to an embodiment of the present disclosure.

Referring to FIG. 14, an embodiment of the present disclosure also provides a manufacturing method of the light-emitting device provided by the embodiments of the present disclosure. The method includes S10, further S100, S200 and S300.

S10, an anode, a light-emitting layer, an electron transfer layer and a cathode which are sequentially arranged in a stacking mode are formed.

Forming the electron transfer layer further includes S100, S200 and S300.

S100, a first solution containing inner core particles is formed. In some embodiments, a first solution containing ZnO nanoparticles may be formed.

In some embodiments, forming the first solution containing ZnO nanoparticles includes:

forming a first precursor solution by dissolving $Zn(OAc)_2$ into a mixed solvent of dimethyl sulfoxide and dimethoxyethanol;

forming a second precursor solution by dissolving tetramethylammonium hydroxide pentahydrate into ethanol;

respectively performing heat preservation on the first precursor solution and the second precursor solution at a first temperature for a first time;

rapidly injecting the first precursor solution into the second precursor solution while stirring, maintaining the first temperature, and stirring a mixture for a second time;

adding ethyl acetate of which the volume is twice that of the mixture, and performing precipitation, centrifugation and purification; and re-dispersing the purified ZnO nanoparticles into absolute ethyl alcohol, and adding an ethanolamine stabilizer to form a stable ZnO nanoparticle colloidal solution.

S200, a second solution containing elements contained in a shell layer is formed. In some embodiments, tin tetrachloride may be slowly dropwise added into dichloromethane in an anhydrous and oxygen-free environment, and continuous stirring is carried out to form a transparent and uniform second solution.

S300, the second solution is added into the first solution, and uniform mixing and heating are carried out to form an inner core wrapped with the shell layer.

In some embodiments, the step that the second solution is added to the first solution, uniform mixing and heating are carried out to form the inner core wrapped with the shell layer may include that:

the ZnO nanoparticle colloidal solution is added into the second solution while stirring, and after uniform mixing is carried out, the mixed solution is poured into a high-pressure reaction kettle;

the reaction kettle is placed in a drying oven at a second temperature, and heat preservation reaction lasts for a third time;

the temperature of the reaction kettle is reduced to a third temperature, ethyl acetate is added, and $ZnO/SnO_2$ nanoparticle precipitate with a white core/shell structure is separated out;

after centrifuging is carried out, supernatant is poured out, absolute ethyl alcohol is added, and white precipitate is re-dispersed; and ethanolamine is added to form a transparent and uniform $ZnO/SnO_2$ nanoparticle colloidal solution.

In some embodiments, the manufacturing method provided by the embodiment of the present disclosure further includes that: a first film is formed between the cathode and the electron transfer layer, and the material of the first film is the same as the material of the shell layer.

In some embodiments, the manufacturing method provided by the embodiment of the present disclosure further includes: a second film is formed between the electron transfer layer and the light-emitting layer, and the material of the second film is the same as the material of the shell layer.

In some embodiments, after the second filling layer is formed and before the cathode is formed, the manufacturing method provided by the embodiment of the present disclosure further includes: the first film, the electron transfer layer and the second film are treated by an annealing process, so that the first film is converted into the first filling layer, and the second film is converted into the second filling layer.

An embodiment of the present disclosure further provides a manufacturing method of a light-emitting device, including following operations.

First, the core/shell structure $ZnO/SnO_2$ nanoparticles are synthesized.

A, the ZnO nanoparticle inner core is prepared by:

preparation of a precursor solution 1 (the first precursor solution): 220 mg (1 mmol) of $Zn(OAc)_2$ is weighed and dissolved in a mixed solvent of 10 mL of dimethyl sulfoxide and 8 mL of dimethoxyethanol;

preparation of a precursor solution 2 (the second precursor solution): 330 mg (1.85 mmol) of tetramethylammonium hydroxide pentahydrate (TMAH) is weighed and dissolved in 3.3 mL of ethanol;

after the precursor solution 1 and the precursor solution 2 are respectively subjected to heat preservation at the temperature of 0° C. for 30 min, the precursor solution 1 is rapidly injected into the precursor solution 2 under violent stirring, and violent stirring reaction lasts for 3 h while the reaction system maintains at the temperature of 0° C.; and after the reaction is finished, ethyl acetate with the volume twice that of the system is added in the system for precipitation, centrifuging is carried out, synthesized ZnO nanoparticles are purified, the purified ZnO nanoparticles are re-dispersed into 20 mL of absolute ethyl alcohol, 0.2 mL of an ethanolamine stabilizer is added to form a stable ZnO nanoparticle colloidal solution, and the ZnO nanoparticles synthesized by the reaction in the step are used as the inner core of the subsequent core/shell structure $ZnO/SnO_2$ nanoparticles.

B, the core/shell structure $ZnO/SnO_2$ nanoparticles are synthesized by:

a precursor solution 3: 1.5 mL of tin tetrachloride is slowly dropwise added into 10 mL of dichloromethane in an anhydrous and oxygen-free environment, and the mixture is continuously stirred to obtain a transparent uniform solution; and 20 mL of the ZnO nanoparticle inner core colloidal solution synthesized in the step A is slowly added into the precursor solution 3 in a stirring state, and the mixed solution is poured into a high-pressure reaction kettle (50 mL) after the system is uniformly mixed; the reaction kettle is placed in a drying oven at the temperature of 100° C., heat preservation reaction lasts for 20 hours, then the temperature of the reaction kettle is reduced to be 25° C., 20 mL of ethyl acetate is added, white core/shell structure $ZnO/SnO_2$ nanoparticle precipitate is separated out, the mixture is centrifuged, supernatant is poured out, 20 mL of absolute ethyl alcohol is added to re-disperse the white precipitate, and 0.5 mL of ethanolamine is added to form a transparent and uniform $ZnO/SnO_2$ nanoparticle colloidal solution.

Second, a QLED device is prepared.

By taking a red light quantum dot device as an example, the structure of the device is designed to be ITO/PEDOT:

PSS/TFB/RQD/(ZnO/SnO$_2$)/Al, and core-shell structure ZnO/SnO$_2$ nanoparticles are designed and synthesized to be used as a light-emitting device which is not limited to red light quantum dots, is suitable for quantum dot light-emitting diodes in any color and is not limited to quantum dot materials (quantum dots including CdS, CdSe, ZnSe, InP, PbS, CsPbCl$_3$, CsPbBr$_3$, CsPhI$_3$, CdS/ZnS, CdSe/ZnS, InP/ZnS, PbS/ZnS, CsPbCl$_3$/ZnS, CsPbBr$_3$/ZnS, CsPhI$_3$/ZnS and the like).

The preparation processes of the device are as follows.

1, An ITO glass substrate (substrate) is ultrasonically cleaned by using absolute ethyl alcohol for 15 minutes and then ultrasonically cleaned by using deionized water for another 15 minutes, dried, and irradiated by using an ultraviolet lamp for 10 minutes to improve the surface work function of ITO.

2, After the above treatment, a hole injection layer PEDOT:PSS is deposited on the substrate ITO in a spin-coating mode, and the HI surface morphology is improved through heating at the temperature of 120° C. and is annealed for 15 minutes.

3, A hole transfer layer material TFB is spin-coated on the surface of the HI layer, annealing treatment is carried out at the temperature of 120° C. for 15 minutes, and the solvent is removed.

4, A red quantum dot layer is deposited on the TFB film layer in a spin-coating manner, and annealing treatment is carried out at the temperature of 100° C. for 15 minutes to form a flat QD layer.

5, A SnO$_2$ film with the thickness of 5-10 nm is sputtered on the surface of the QD layer through sputter coating equipment to fill gaps and defects among the quantum dots so that the quantum dots can be in close contact with the electron transfer material, and the surfaces of the quantum dots are flattened.

6, Electron transfer material core/shell structure ZnO/SnO$_2$ nanoparticles are deposited on the SnO$_2$ flattened QD surface in a spin-coating manner.

7, A SnO$_2$ film with the thickness of 5-10 nm is sputtered on the surfaces of the ZnO/SnO$_2$ nanoparticles through the sputter coating equipment to fill gaps and defects among the ZnO/SnO$_2$ nanoparticles, so that the surfaces of the ZnO/SnO$_2$ nanoparticles are flattened, and subsequent evaporation of a flat and uniform electrode film is facilitated; (in the structure of the device, ZnO nanoparticles are fully wrapped by a SnO$_2$ material, surface defects of the ZnO nanoparticles are filled to the maximum extent, the stability of the ZnO nanoparticles is improved, the efficiency of the device is improved, and the service life of the device is prolonged).

8, Annealing treatment is carried out at the temperature of 150° C. for 20 minutes to improve an interface environment, so that a thin layer SnO$_2$ and the shell layer SnO$_2$ of the core-shell structure ZnO/SnO$_2$ form a uniform crystal phase, the interface contact is more compact, and interface defects are reduced. That is also the reason for preparing the films from the material of the shell layer on the two sides of the core/shell structure ZnO nanoparticle film, after the same materials are subjected to high-temperature annealing recrystallization, the uniform crystal phase can be formed, interface defects are fewer, but different materials generate interface stress and increase interface detects due to lattice mismatch.

9, Vacuum evaporation is carried out on an Al electrode.

10, A glass cover plate is used for encapsulation to complete preparation of the device.

An embodiment of the present disclosure further provides a manufacturing method of another light-emitting device, including following operations.

By taking a red light multi-electron quantum dot device as an example, core-shell structure ZnO/Al$_2$O$_3$ nanoparticles are designed and synthesized as an electron transfer material (the insulativity of the Al$_2$O$_3$ material can significantly reduce the electron transfer rate of ZnO and is beneficial to improving injection balance of carriers of the device, and meanwhile, the Al$_2$O$_3$ material can fill the surface defects of the ZnO nanoparticles, improve the water and oxygen resistance of ZnO and improve the performance of the device), and the structure of the device is designed as ITO/PEDOT:PSS/TFB/RQD/Al$_2$O$_3$(ZnO/Al$_2$O$_3$)Al$_2$O$_3$/Al.

The preparation processes of the light-emitting device are as follows.

1, An ITO glass substrate is ultrasonically cleaned by using absolute ethyl alcohol for 15 minutes and then ultrasonically cleaned by using deionized water for another 15 minutes, dried, and irradiated by using an ultraviolet lamp for 10 minutes to improve the surface work function of ITO.

2, After the above treatment, a hole injection layer PEDOT:PSS is deposited on the substrate ITO in a spin-coating mode, and the HI surface morphology is improved through heating at the temperature of 120° C. and annealing for 15 minutes.

3, A hole transfer layer material (the material specifically may be TFB) is spin-coated on the surface of the hole injection layer (HI), and is subjected to annealing treatment at the temperature of 120° C. for 15 minutes, and a solvent is improved.

4, A red quantum dot layer is deposited on the hole transfer layer in a spin-coating manner, and annealing treatment is carried out at the temperature of 100° C. for 15 minutes to form a flat QD layer.

5, An Al$_2$O$_3$ film with the thickness of 5-10 nm is sputtered on the surface of the QD layer through the sputter coating equipment to fill gaps and defects among the quantum dots so that the quantum dots can be in close contact with the electron transfer material, and the surfaces of the quantum dots are flattened.

6, Electron transfer material core/shell structure ZnO/Al$_2$O$_3$ nanoparticles are deposited on the surface of the Al$_2$O$_3$ flattened QD surface in a spin-coating manner, annealing treatment is carried out at the temperature of 120° C. for 15 minutes, and a solvent and organic matters are removed.

7, An Al$_2$O$_3$ film with the thickness of 5-10 nm is sputtered on the surface of the ZnO/Al$_2$O$_3$ nanoparticles through the sputter coating equipment to fill gaps and defects among the ZnO/Al$_2$O$_3$ nanoparticles, the surfaces of the ZnO/Al$_2$O$_3$ nanoparticles are flattened, and subsequent evaporation of a flat and uniform electrode film is facilitated; (in the structure of the device, the ZnO nanoparticles are fully wrapped by the Al$_2$O$_3$ material, so that surface defects of the ZnO nanoparticles are filled to the maximum extent, the stability of the ZnO nanoparticles is improved, the efficiency of the device is improved, and the service life of the device is prolonged).

8, Annealing treatment is carried out at the temperature of 150° C. for 20 minutes to improve the interface environment, so that the thin layer Al$_2$O$_3$ and the shell layer Al$_2$O$_3$ of the core-shell structure ZnO/Al$_2$O$_3$ form a uniform crystal phase, the interface contact is more compact, and interface defects are reduced. That is also the reason for preparing the films from the material of the shell layer on the two sides of the core/shell structure ZnO nanoparticle film, after the same materials are subjected to high-temperature annealing recrystallization, the uniform crystal phase can be formed, interface defects are fewer, but different materials generate interface stress and increase interface detects due to lattice mismatch.

9, Vacuum evaporation is carried out on an Al electrode.

10, A glass cover plate is used for encapsulation to complete preparation of the device.

The embodiments of the present disclosure have the beneficial effects that the light-emitting device provided by the embodiment of the present disclosure includes the electron transfer layer, the material of the electron transfer layer includes the inner core and the shell layer wrapping the inner core, wherein the shell layer may encapsulate the inner core to isolate external water and oxygen, so that the chemical stability of the inner core may be improved, the water and oxygen resistance of the light-emitting device is improved, and the service life of the light-emitting device is prolonged; and in addition, the shell layer may passivate surface defects of the inner core, the problem that the defects of the surface of the inner core may quench light emitted from the light-emitting layer in the light-emitting device when the light-emitting device only with the inner core is applied to the light-emitting device is solved, meanwhile, the shell layer may reduce the energy level barrier of the electrons migrating from the electron transfer layer to the light-emitting layer, injection of the electrons is facilitated, the light-emitting device may have lower turn-on voltage and higher current density, and the light-emitting device has better light-emitting performance. Moreover, the balance of carriers in the light-emitting device may be controlled by regulating and controlling the inner core and the shell layer, when the number of the electrons reaching the light-emitting layer in unit time is larger than the number of the holes reaching the light-emitting layer in unit time and the difference value between the number of the electrons reaching the light-emitting layer in unit time and the number of the holes reaching the light-emitting layer in unit time exceeds the preset threshold range, the particle size of the inner core is reduced and/or the thickness of the shell layer is increased to promote the balance of the holes and the electrons in the light-emitting layer; and when the number of the electrons reaching the light-emitting layer in unit time is smaller than the number of the holes reaching the light-emitting layer in unit time and the difference value between the number of the electrons reaching the light-emitting layer in unit time and the number of the holes reaching the light-emitting layer in unit time exceeds the preset threshold range, the particle size of the inner core is increased and/or the thickness of the shell layer is reduced so as to promote balance of the holes and the electrons in the light-emitting layer 104.

What is claimed is:

1. A light-emitting device, comprising:
   an anode, a light-emitting layer and a cathode sequentially arranged in a stacking mode; and
   an electron transfer layer located between the light-emitting layer and the cathode, wherein the electron transfer layer is configured to enable a difference value between a quantity of electrons reaching the light-emitting layer in unit time and a quantity of holes reaching the light-emitting layer in unit time to be located in a preset threshold range; wherein
   a material of the electron transfer layer comprises: an inner core and a shell layer wrapping the inner core, wherein the quantity of the electrons reaching the light-emitting layer in unit time is regulated and controlled by conductivity of the inner core and conductivity of the shell layer;
   when the quantity of the electrons reaching the light-emitting layer in unit time is greater than the quantity of the holes reaching the light-emitting layer in unit time, and the difference value between the quantity of the electrons reaching the light-emitting layer in unit time and the quantity of the holes reaching the light-emitting layer in unit time exceeds the preset threshold range, a particle size of the inner core is reduced and/or a thickness of the shell layer is increased to enable the difference value between the quantity of the electrons reaching the light-emitting layer in unit time and the quantity of the holes reaching the light-emitting layer in unit time to be located in the preset threshold range; and
   when the quantity of the electrons reaching the light-emitting layer in unit time is smaller than the quantity of the holes reaching the light-emitting layer in unit time, and the difference value between the quantity of the electrons reaching the light-emitting layer in unit time and the quantity of the holes reaching the light-emitting layer in unit time exceeds the preset threshold range, the particle size of the inner core is increased and/or the thickness of the shell layer is reduced to enable the difference value between the quantity of the electrons reaching the light-emitting layer in unit time and the quantity of the holes reaching the light-emitting layer in unit time to be located in the preset threshold range.

2. The light-emitting device according to claim 1, wherein at least a first filling layer is filled in a gap between the cathode and the shell layer, and a material of the first filling layer and a material of the shell layer are the same; and/or at least a second filling layer is filled in a gap between the shell layer and the light-emitting layer, and a material of the second filling layer and the material of the shell layer are the same.

3. The light-emitting device according to claim 2, wherein a thickness of the first filling layer is greater than or equal to a thickness of the electron transfer layer; or a thickness of the second filling layer is greater than or equal to a thickness of the electron transfer layer.

4. The light-emitting device according to claim 2, wherein a thickness of the second filling layer is greater than or equal to a thickness of the light-emitting layer.

5. The light-emitting device according to claim 2, wherein the first filling layer is a film layer treated by an annealing process, and a crystal phase of the first filling layer is the same as a crystal phase of the shell layer; and/or the second filling layer is a film layer treated by an annealing process, and a crystal phase of the second filling layer is the same as a crystal phase of the shell layer.

6. The light-emitting device according to claim 1, wherein a material of the shell layer is metal oxide.

7. The light-emitting device according to claim 6, wherein in the metal oxide, metal is in a highest valence state.

8. The light-emitting device according to claim 5, wherein a material of the shell layer comprises one or a combination of:
   $SnO_2$;
   $Cu_2O$;
   $Fe_2O_3$;
   $TiO_2$;
   $ZrO_2$;
   $CoO$;
   $WO_3$;

In$_2$O$_3$;
Al$_2$O$_3$; and
Fe$_3$O$_4$.

9. The light-emitting device according to claim 1, wherein a material of the inner core comprises one or a combination of: ZnO, ZnMgO, ZnAlO, ZnLiO and ZnAgO.

10. The light-emitting device according to claim 1, wherein a thickness of the shell layer ranges from 0.1 nm to 100 nm; and the inner core is nanoparticles having a particle size of the inner core ranging from 0.1 nm to 100 nm.

11. The light-emitting device according to claim 1, wherein an electron transfer rate of a material of the shell layer is smaller than an electron transfer rate of a material of the inner core.

12. The light-emitting device according to claim 1, wherein a depth of an energy level of a bottom of a conduction band of the shell layer is greater than a depth of an energy level of a bottom of a conduction band of the inner core; and a depth of an energy level of a valence band maximum of the shell layer is greater than a depth of an energy level of a valence band maximum of the inner core.

13. The light-emitting device according to claim 1, wherein a band gap width of the shell layer is in negative correlation to the thickness of the shell layer.

14. The light-emitting device according to claim 1, wherein a depth of an energy level of a bottom of a conduction band of the shell layer is in negative correlation to the thickness of the shell layer.

15. The light-emitting device according to claim 2, wherein the light-emitting layer is an organic light-emitting layer; or the light-emitting layer is a quantum dot light-emitting layer.

16. The light-emitting device according to claim 15, wherein when the light-emitting layer is the quantum dot light-emitting layer, the light-emitting layer comprises a plurality of light-emitting portions with different particle size quantum dots, the second filling layer comprises a plurality of regulation and control portions corresponding to the light-emitting portions, and a thickness of each regulation and control portion is in positive correlation to a corresponding quantum dot particle size.

17. The light-emitting device according to claim 1, further comprising a substrate, wherein the anode, the light-emitting layer, the electron transfer layer and the cathode are sequentially arranged on one side of the substrate; or the cathode, the electron transfer layer, the light-emitting layer and the anode are sequentially arranged on one side of the substrate; wherein a hole injection layer is arranged between the anode and the light-emitting layer, and a hole transfer layer is further arranged between the hole injection layer and the light-emitting layer.

18. A display apparatus, comprising a light-emitting device, wherein the light-emitting device comprises:
an anode, a light-emitting layer and a cathode sequentially arranged in a stacking mode; and
an electron transfer layer located between the light-emitting layer and the cathode, wherein the electron transfer layer is configured to enable a difference value between a quantity of electrons reaching the light-emitting layer in unit time and a quantity of holes reaching the light-emitting layer in unit time to be located in a preset threshold range; wherein
a material of the electron transfer layer comprises: an inner core and a shell layer wrapping the inner core,
wherein the quantity of the electrons reaching the light-emitting layer in unit time is controlled by conductivity of the inner core and conductivity of the shell layer;
when the quantity of the electrons reaching the light-emitting layer in unit time is greater than the quantity of the holes reaching the light-emitting layer in unit time, and the difference value between the quantity of the electrons reaching the light-emitting layer in unit time and the quantity of the holes reaching the light-emitting layer in unit time exceeds the preset threshold range, a particle size of the inner core is reduced and/or a thickness of the shell layer is increased to enable the difference value between the quantity of the electrons reaching the light-emitting layer in unit time and the quantity of the holes reaching the light-emitting layer in unit time to be located in the preset threshold range; and
when the quantity of the electrons reaching the light-emitting layer in unit time is smaller than the quantity of the holes reaching the light-emitting layer in unit time, and the difference value between the quantity of the electrons reaching the light-emitting layer in unit time and the quantity of the holes reaching the light-emitting layer in unit time exceeds the preset threshold range, the particle size of the inner core is increased and/or the thickness of the shell layer is reduced to enable the difference value between the quantity of the electrons reaching the light-emitting layer in unit time and the quantity of the holes reaching the light-emitting layer in unit time to be located in the preset threshold range.

19. A manufacturing method of the light-emitting device according to claim 1, comprising:
forming the anode, the light-emitting layer, the electron transfer layer and the cathode sequentially arranged in a stacking mode; wherein
forming the electron transfer layer comprises:
forming a first solution containing inner core particles;
forming a second solution containing elements contained in the shell layer; and
adding the second solution into the first solution, uniformly mixing the second solution with the first solution, and heating a mixture to form the inner core wrapped with the shell layer.

20. The manufacturing method according to claim 19, further comprising:
forming a first film between the cathode and the electron transfer layer, wherein a material of the first film is the same as a material of the shell layer; and
forming a second film between the electron transfer layer and the light-emitting layer, wherein a material of the second film is the same as the material of the shell layer;
wherein after a second filling layer is formed and before the cathode is formed, the manufacturing method further comprises:
treating the first film, the electron transfer layer and the second film by using an annealing process to enable the first film to be converted into a first filling layer and to enable the second film to be converted into the second filling layer.

* * * * *